(12) United States Patent
Lee et al.

(10) Patent No.: US 7,482,677 B2
(45) Date of Patent: Jan. 27, 2009

(54) DIELECTRIC STRUCTURES HAVING HIGH DIELECTRIC CONSTANTS, AND NON-VOLATILE SEMICONDUCTOR MEMORY DEVICES HAVING THE DIELECTRIC STRUCTURES

(75) Inventors: Jong-Cheol Lee, Seoul (KR); Sung-Tae Kim, Seoul (KR); Young-Sun Kim, Suwon-si (KR); Cha-Young Yoo, Suwon-si (KR); Gab-Jin Nam, Seoul (KR); Young-Geun Park, Suwon-si (KR); Jae-Hyoung Choi, Gwangmyeong-si (KR); Jae-Hyun Yeo, Bucheon-si (KR); Ha-Jin Lim, Seoul (KR); Yun-Seok Kim, Seoul (KR)

(73) Assignee: Samsung Electronics Co., Ltd. (KR)

( * ) Notice: Subject to any disclaimer, the term of this patent is extended or adjusted under 35 U.S.C. 154(b) by 187 days.

(21) Appl. No.: 11/339,086

(22) Filed: Jan. 25, 2006

(65) Prior Publication Data

US 2006/0244147 A1    Nov. 2, 2006

(30) Foreign Application Priority Data

Jan. 25, 2005    (KR) .................... 10-2005-0006547

(51) Int. Cl.
    *H01L 21/4763*    (2006.01)
(52) U.S. Cl. ..................................... 257/649
(58) Field of Classification Search ................. 257/314, 257/324–325, 639, 649; 438/261, 287, 785–791
    See application file for complete search history.

(56) References Cited

U.S. PATENT DOCUMENTS 5,057,448 A * 10/1991 Kuroda ....................... 438/241

(Continued)

FOREIGN PATENT DOCUMENTS

KR    1998-032692    7/1998

(Continued)

OTHER PUBLICATIONS

Wilk et al., Electrical porperties of hafnium silicate gate dielectrics deposited directly on silicon, May 10, 1999, Applied Physics Letters, vol. 74 No. 19, pp. 2854-2856.*

*Primary Examiner*—Calvin Lee
(74) *Attorney, Agent, or Firm*—Myers Bigel Sibley & Sajovec, P.A.

(57) ABSTRACT

In a method of manufacturing a dielectric structure, after a tunnel oxide layer pattern is formed on a substrate, a floating gate is formed on the tunnel oxide layer. After a first dielectric layer pattern including a metal silicon oxide and a second dielectric layer pattern including a metal silicon oxynitride are formed, a control gate is formed on the dielectric structure. Since the dielectric structure includes at least one metal silicon oxide layer and at least one metal silicon oxynitride layer, the dielectric structure may have a high dielectric constant and a good thermal resistance. A non-volatile semiconductor memory device including the dielectric structure may have good electrical characteristics such as a large capacitance and a low leakage current.

7 Claims, 8 Drawing Sheets

U.S. PATENT DOCUMENTS

| | | |
|---|---|---|
| 6,783,997 B2 * | 8/2004 | Rotondaro et al. ............ 438/3 |
| 6,797,567 B2 | 9/2004 | Chang |
| 2003/0141536 A1 * | 7/2003 | Weimer ...................... 257/314 |
| 2004/0046197 A1 * | 3/2004 | Basceri et al. ............. 257/296 |
| 2004/0195094 A1 * | 10/2004 | Irumata et al. ......... 204/298.13 |
| 2004/0201058 A1 * | 10/2004 | Sonoda et al. .............. 257/314 |
| 2005/0046007 A1 * | 3/2005 | Nakamura et al. .......... 257/686 |

FOREIGN PATENT DOCUMENTS

| | | |
|---|---|---|
| KR | 1999-0077767 | 10/1999 |
| KR | 1020040057535 | 7/2004 |
| KR | 1020040072051 | 8/2004 |

* cited by examiner

DIELECTRIC STRUCTURES HAVING HIGH DIELECTRIC CONSTANTS, AND NON-VOLATILE SEMICONDUCTOR MEMORY DEVICES HAVING THE DIELECTRIC STRUCTURES

CROSS-REFERENCE TO RELATED APPLICATIONS

This application claims priority under 35 USC § 119 to Korean Patent Application No. 2005-6547 filed on Jan. 25, 2005, the contents of which are herein incorporated by reference in their entirety.

FIELD OF THE INVENTION

The present invention relates generally to non-volatile semiconductor memory devices and, more particularly, to methods of forming structures for non-volatile semiconductor memory devices.

BACKGROUND OF THE INVENTION

Semiconductor memory devices are generally divided into volatile semiconductor memory devices that lose data as time passes, such as a dynamic random access memory (DRAM) device or a static random access memory (SRAM) device, and non-volatile semiconductor memory devices. The non-volatile semiconductor memory devices have characteristics that maintain data stored therein even though time passes by. Thus, non-volatile semiconductor memory devices, such as flash memory devices, of which data may be electrically input and output, are widely used.

In a conventional flash memory device, a memory cell storing data generally has a stacked structure that includes a tunnel oxide layer formed on a silicon substrate, a floating gate formed on the tunnel oxide layer, a dielectric layer formed on the floating gate and a control gate formed on the dielectric layer. In the memory cell of a flash memory device having the above structure, data may be stored by injecting electrons into the floating gate while applying proper voltages to the control gate and the substrate. Here, the dielectric layer may maintain electrons accumulated in the floating gate and transfer the voltage applied to the control gate into the floating gate.

FIG. 1 is a cross-sectional view illustrating a conventional non-volatile semiconductor memory device.

Referring to FIG. 1, the conventional non-volatile semiconductor memory device includes a tunnel oxide layer 10 formed on a semiconductor substrate 5 having an isolation layer (not shown), a floating gate 15 formed on the tunnel oxide layer 10, a dielectric layer 35 formed on the floating gate 15, and a control gate 40 formed on the dielectric layer 35. The dielectric layer 35 has an oxide/nitride/oxide (ONO) structure in which a first oxide film 20, a nitride film 25 and a second oxide film 30 are formed. The floating gate 15 and the control gate 40 generally include polysilicon doped with impurities.

In conventional non-volatile semiconductor memory devices, data may be stored or erased by injecting or extracting electrons into or out of the floating gate 15 while applying predetermined voltages to the control gate 40 and the semiconductor substrate 5. Here, the dielectric layer 35 maintains the electrons charged in the floating gate 15 and transfers the predetermined voltage to the floating gate 15. However, in conventional non-volatile semiconductor memory devices having the above construction, since the dielectric layer 35 has several films of oxide and the nitride, the dielectric layer may not have a sufficient dielectric constant, and also, a process for forming the dielectric layer may be complicated. Additionally, the dielectric layer may be somewhat thick because the dielectric layer includes several films.

To solve the above-mentioned problems, Korean Laid-Open Patent Publication No. 1998-32692 discloses a semiconductor device including a dielectric layer formed using aluminum oxide ($Al_2O_3$), yttrium oxide ($Y_2O_3$), tantalum oxide ($Ta_2O_5$) or vanadium oxide ($V_2O_5$) doped with an element in Group IV, such as zirconium (Zr), silicon (Si), titanium (Ti) or hafnium (Hf). In addition, Korean Laid-Open Patent Publication No. 1999-77767 discloses a floating gate memory device having a dielectric layer that includes aluminum oxide, yttrium oxide, aluminum oxide doped with an element in Group IV, such as zirconium or silicon (Si), yttrium oxide doped with an element in Group IV, or tantalum oxide doped with an element in Group IV. However, when the dielectric layer including the metal oxide doped with the element in Group IV is employed in a non-volatile semiconductor memory device, even though the dielectric layer may have a reduced thickness, a leakage current may be generated from the dielectric layer, and also, the dielectric layer may not have a sufficient dielectric constant.

SUMMARY OF THE INVENTION

Some embodiments of the present invention provide a dielectric structure having a high dielectric constant.

Some embodiments of the present invention provide a method of forming a dielectric structure having a high dielectric constant.

Some embodiments of the present invention provide a non-volatile semiconductor memory device including a dielectric structure that has a high dielectric constant.

Some embodiments of the present invention provide a method of manufacturing a non-volatile semiconductor memory device including a dielectric structure that has a high dielectric constant.

According to some embodiments of the present invention, there is provided a dielectric structure. The dielectric structure includes at least one first dielectric layer pattern including a metal silicon oxide and at least one second dielectric layer pattern including a metal silicon oxynitride.

According to some embodiments of the present invention, the metal silicon oxide may have a composition represented by the following chemical formula (1):

$$M_xSi_yO_2 \qquad (1)$$

In the chemical formula (1), M represents a metal, $0<x\leqq 1$, $0\leqq y\leqq 1$ and $x+y=1$.

According to some embodiments of the present invention, the metal silicon oxynitride may have a composition represented by the following chemical formula (2):

$$M_xSi_yO_{2-z}N_z \qquad (2)$$

In the chemical formula (2), M represents a metal, $0<x\leqq 1$, $0<y\leqq 1$, $x+y=1$ and $0<z\leqq 1$.

According to some embodiments of the present invention, the dielectric structure may have a composition represented by the following chemical formula (3):

$$[M_xSi_yO_2/M_xSi_yO_{2-z}N_z]_A \qquad (3)$$

In the chemical formula (3), A is a positive integer, $0<x\leqq 1$, $0<y\leqq 1$, $x+y=1$ and $0<z\leqq 1$.

According to some embodiments of the present invention, the second dielectric layer pattern may be formed from the first dielectric layer pattern.

According to some embodiments of the present invention, the first dielectric layer pattern may include a metal silicon oxide including a transition metal in Group IV, a metal silicon oxide including a transition metal in Group V or a metal silicon oxide including a rare earth metal. For example, the metal silicon oxide may include a metal such as titanium (Ti), zirconium (Zr), hafnium (Hf), vanadium (V), niobium (Nb), tantalum (Ta), scandium (Sc), yttrium (Y) or lanthanum (La).

According to some embodiments of the present invention, the second dielectric layer pattern may include a metal silicon oxynitride including a transition metal in Group IV, a metal silicon oxynitride including a transition metal in Group V or a metal silicon oxynitride including a rare earth metal. For example, the metal silicon oxynitride may include a metal such as titanium, zirconium, hafnium, vanadium, niobium, tantalum, scandium, yttrium or lanthanum.

According to some embodiments of the present invention, there is provided a method of forming a dielectric structure. In the method of forming the dielectric structure, at least one first dielectric layer including a metal silicon oxide is formed on a substrate having a conductive layer pattern. At least one second dielectric layer including a metal silicon oxynitride is formed on the first dielectric layer by treating the first dielectric layer using a plasma. At least one first dielectric layer pattern and at least one second dielectric layer pattern are formed on the conductive layer pattern by partially etching the first dielectric layer and the second dielectric layer.

According to some embodiments of the present invention, the first dielectric layer may be formed by a chemical vapor deposition (CVD) process, an atomic layer deposition (ALD) process, a physical vapor deposition (PVD) process or a pulse laser deposition (PLD) process.

According to some embodiments of the present invention, the first dielectric layer may be treated using the plasma including ammonia ($NH_3$) plasma or nitrogen ($N_2$) plasma.

According to some embodiments of the present invention, the first dielectric layer may be treated at a temperature of about 300° C. to about 900° C. for about 60 seconds to about 180 seconds by applying a power of about 250 W to about 800 W.

According to some embodiments of the present invention, the first dielectric layer and the second dielectric layer may be repeatedly formed in order K (K is a positive integer) times.

According to some embodiments of the present invention, there is provided a non-volatile semiconductor memory device. The non-volatile semiconductor memory device includes a tunnel oxide layer pattern formed on a semiconductor substrate, a floating gate formed on the tunnel oxide layer pattern, a dielectric structure formed on the floating gate and a control gate formed on the dielectric structure. The dielectric structure includes at least one first dielectric layer pattern containing a metal silicon oxide and at least one second dielectric layer pattern containing a metal silicon oxynitride.

According to some embodiments of the present invention, the floating gate may include a first conductive layer pattern formed on the tunnel oxide layer pattern and a second conductive layer pattern formed on the first conductive layer pattern.

According to some embodiments of the present invention, the first conductive layer pattern and the second conductive layer pattern may include polysilicon doped with impurities or amorphous silicon.

According to some embodiments of the present invention, the first dielectric layer pattern may include a metal silicon oxide containing a transition metal in Group IV, a metal silicon oxide containing a transition metal in Group V or a metal silicon oxide containing a rare earth metal.

According to some embodiments of the present invention, the second dielectric layer pattern may include a metal silicon oxynitride containing a transition metal in Group IV, a metal silicon oxynitride containing a transition metal in Group V or a metal silicon oxynitride containing a rare earth metal.

According to some embodiments of the present invention, the dielectric structure may include a plurality of first dielectric layer patterns and a plurality of second dielectric layer patterns.

According to some embodiments of the present invention, the control gate may include doped polysilicon or polysilicon and a metal silicide.

According to some embodiments of the present invention, there is provided a method of manufacturing a non-volatile semiconductor memory device. In the method of manufacturing the non-volatile semiconductor memory device, a tunnel oxide layer pattern is formed on a substrate. A floating gate is formed on the tunnel oxide layer pattern. A dielectric structure is formed on the floating gate. The dielectric structure includes at least one first dielectric layer pattern containing a metal silicon oxide and at least one second dielectric layer pattern containing a metal silicon oxynitride. A control gate is formed on the dielectric structure.

According to some embodiments of the present invention, the dielectric structure may be formed by forming at least one first dielectric layer on the floating gate, by forming at least one second dielectric layer on the first dielectric layer, by treating the first dielectric layer using a plasma, and by partially etching the first dielectric layer and the second dielectric layer.

According to some embodiments of the present invention, the first dielectric layer may be formed by a CVD process, an ALD process, a PVD process or a PLD process.

According to some embodiments of the present invention, the first dielectric layer may be treated using the plasma including ammonia plasma or nitrogen plasma.

According to some embodiments of the present invention, the first dielectric layer and the second dielectric layer may be repeatedly formed in order K (K is a positive integer) times.

According to some embodiments of the present invention, a dielectric structure has a high dielectric constant and also has a good thermal resistance because the dielectric structure includes at least one metal silicon oxide layer and at least one metal silicon oxynitride layer. Additionally, non-volatile semiconductor memory device has good electrical characteristics such as a large capacitance and a low leakage current when the non-volatile semiconductor memory device includes the dielectric structure.

BRIEF DESCRIPTION OF THE DRAWINGS

The above and other features and advantages of the present invention will become more apparent by describing embodiments thereof with reference to the accompanying drawings, in which.

DESCRIPTION OF THE EMBODIMENTS

Figure 1:
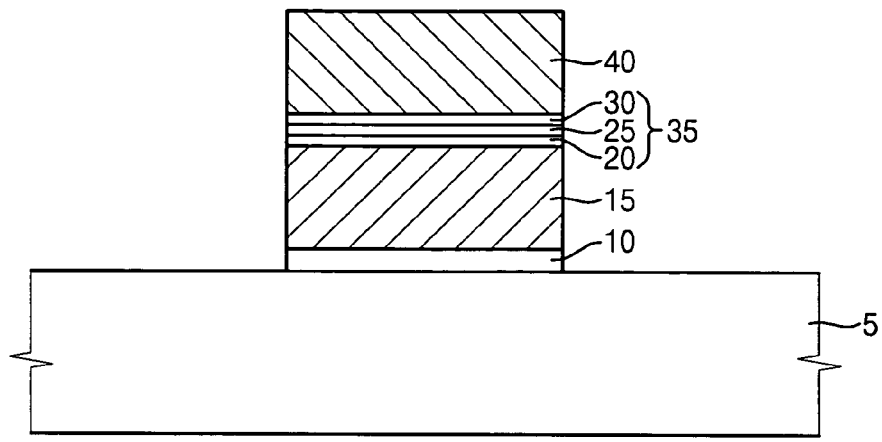
FIG. 1 is a cross-sectional view illustrating a conventional non-volatile semiconductor memory device.

The present invention is described more fully hereinafter with reference to the accompanying drawings, in which some embodiments of the present invention are shown. The present invention may, however, be embodied in many different forms and should not be construed as limited to the embodiments set forth herein. Rather, these embodiments are provided so that this disclosure will be thorough and complete, and will fully convey the scope of the present invention to those skilled in the art. In the drawings, the sizes and relative sizes of layers and regions may be exaggerated for clarity.

It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the present invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments of the present invention are described herein with reference to cross-section illustrations that are schematic illustrations of idealized embodiments (and intermediate structures) of the present invention. As such, variations from the shapes of the illustrations as a result, for example, of manufacturing techniques and/or tolerances, are to be expected. Thus, embodiments of the present invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 2A:
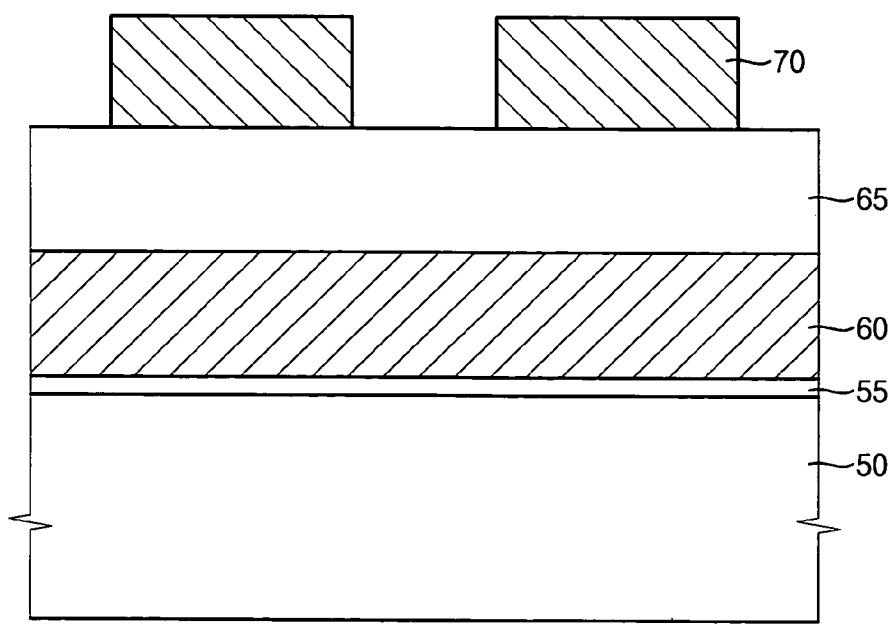
FIGS. 2A to 2H are cross-sectional views illustrating a method of manufacturing a non-volatile semiconductor memory device in accordance with some embodiments of the present invention.
Figure 2B:
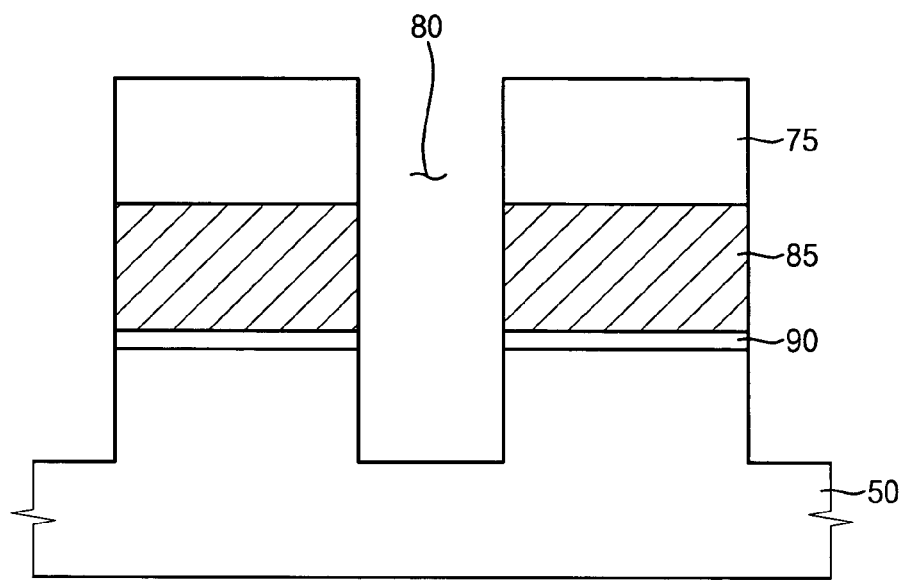
Figure 2C:
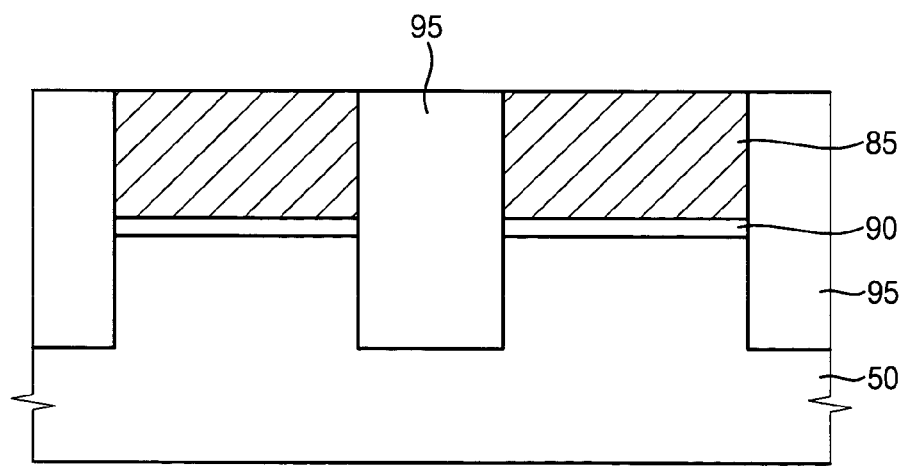
Figure 2D:
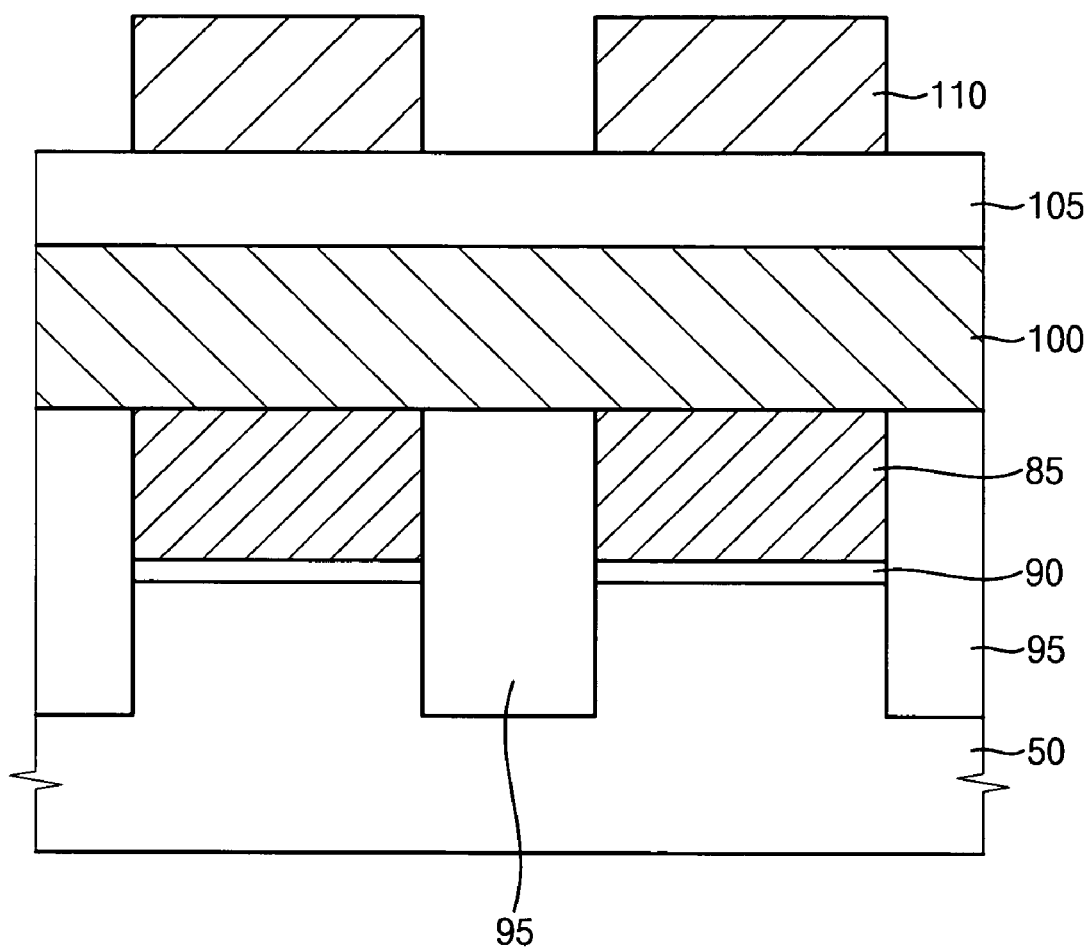
Figure 2E:
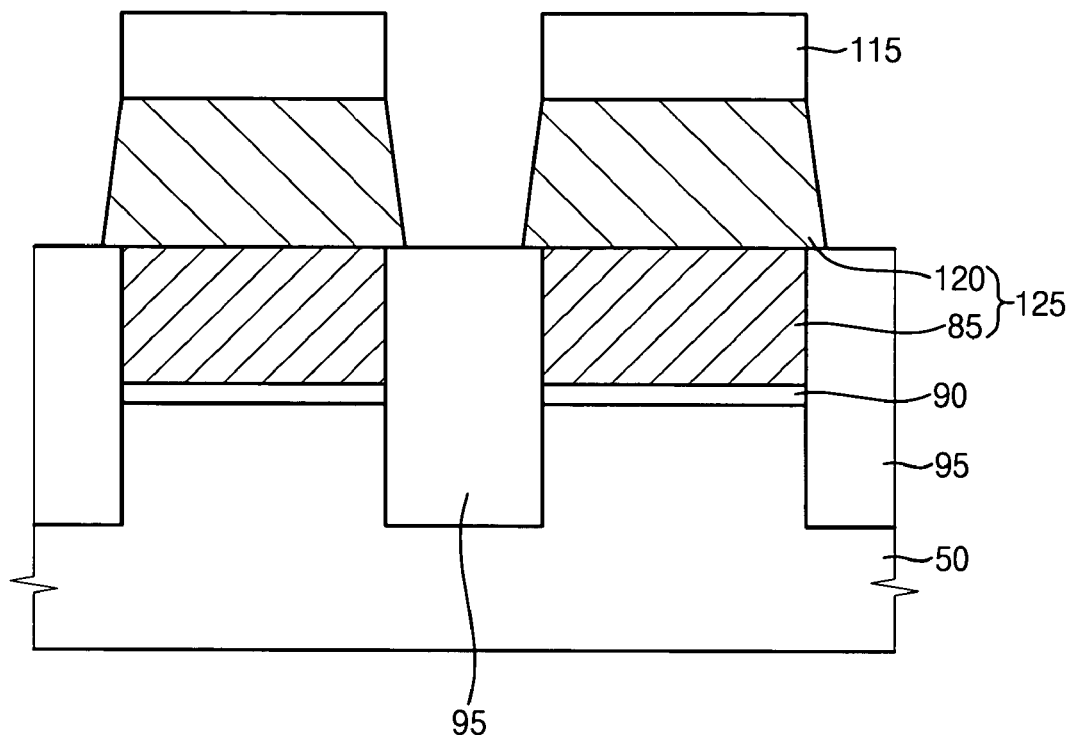
Figure 2F:
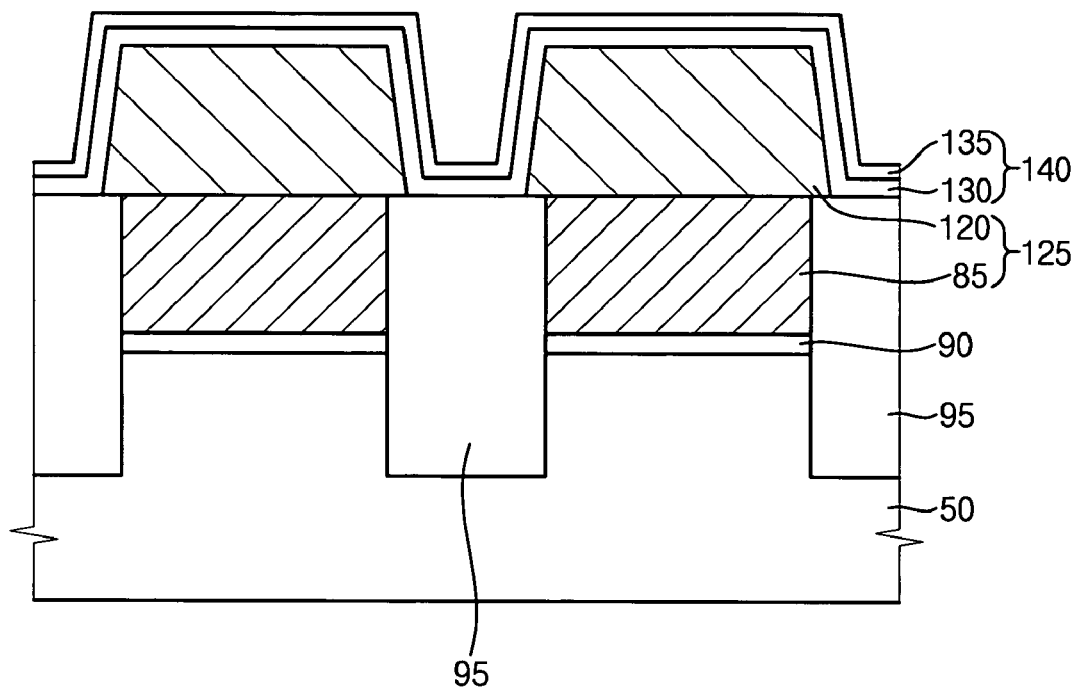
Figure 2G:
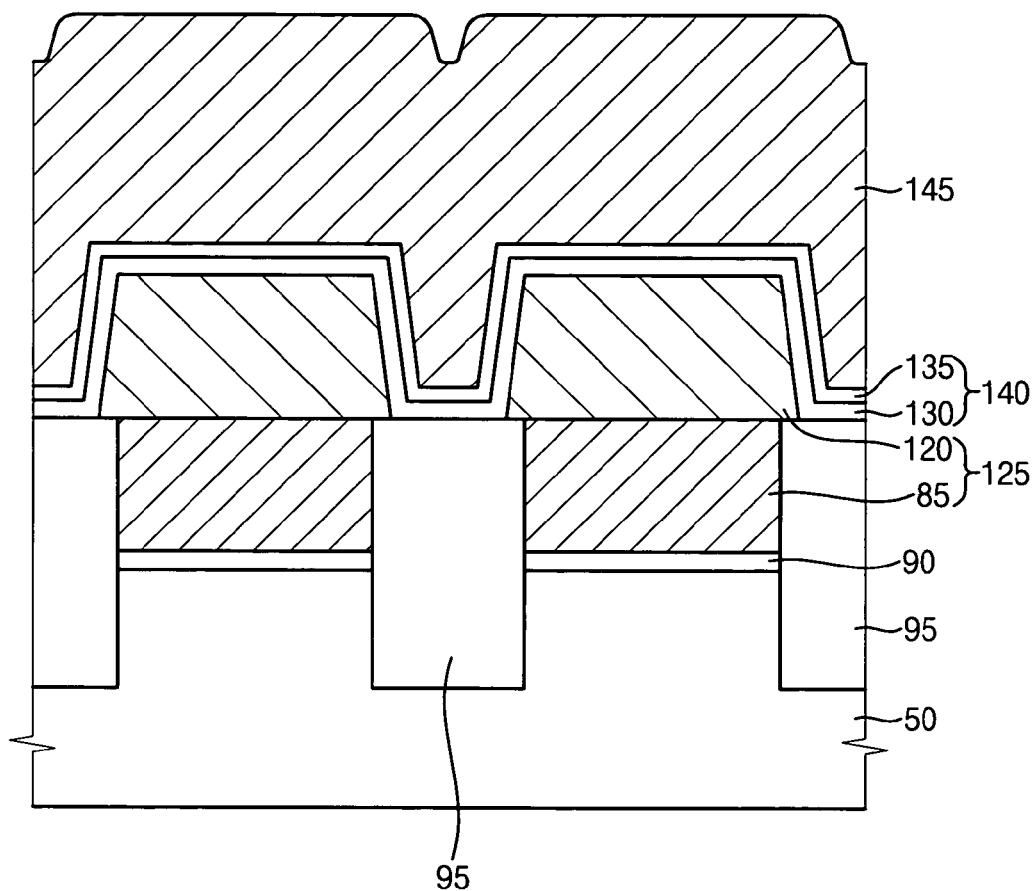
Figure 2H:
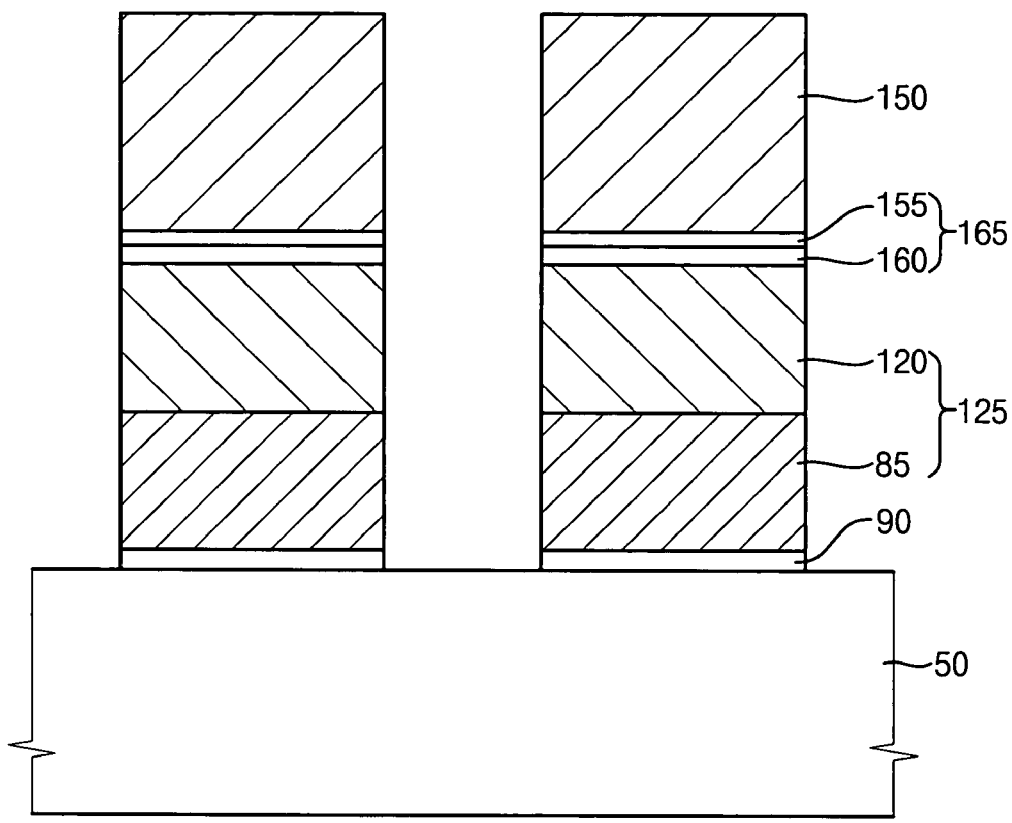

FIGS. 2A to 2H are cross-sectional views illustrating a method of manufacturing a non-volatile semiconductor memory device in accordance with some embodiments of the present invention. FIGS. 2A to 2G are cross-sectional views illustrating the non-volatile semiconductor memory device taken along a first direction substantially perpendicular to a field insulation layer pattern. FIG. 2H is a cross-sectional view illustrating the non-volatile semiconductor memory device taken along a second direction substantially parallel to the field insulation layer pattern.

Referring to FIG. 2A, a tunnel oxide layer 55 is formed on a semiconductor substrate 50 such as a silicon wafer.

The tunnel oxide layer 55 is formed on the semiconductor substrate 50 to have a thickness of about 30 Å to 90 Å. For example, the tunnel oxide layer 55 has a thickness of about 60 Å. The tunnel oxide layer 55 may be formed by a thermal oxidation process or a CVD process. Since data storage capacity of a non-volatile semiconductor memory device mainly depends on a reliability of the tunnel oxide layer 55, the tunnel oxide layer 55 may become a limitation in the number of cycles including programming and erasing. A recent non-volatile semiconductor memory device endures at least about one million times of programming and erasing. Therefore, the tunnel oxide layer 55 may be formed by a radical oxidation process at a high temperature above about 800° C. and a low pressure below about 1.0 Torr under an atmosphere including an oxygen ($O_2$) gas, a hydrogen ($H_2$) gas and a nitrogen ($N_2$) gas. When the tunnel oxide layer 55 is formed by the radical oxidation process, the tunnel oxide layer 55 may have a proper thickness and also have a dense structure.

A first conductive layer 60 is formed on the tunnel oxide layer 55 by a CVD process. The first conductive layer 60 may have a thickness of about 300 Å to 700 Å. For example, the first conductive layer 60 has a thickness of about 500 Å. In particular, after a polysilicon layer or an amorphous silicon layer is formed on the tunnel oxide layer 55, the first conductive layer 60 is formed by doping impurities into the polysilicon layer or the amorphous silicon layer through a $POCl_3$ diffusion process, an ion implantation process or an in-situ doping process.

A first hard mask layer 65 is formed on the first conductive layer 60 by a CVD process. The first hard mask layer 65 may be formed using a material that has an etching selectivity with respect to the first conductive layer 60, the tunnel oxide layer 55 and the semiconductor substrate 50. For example, the first hard mask layer 65 is formed using a nitride such as silicon nitride or an oxynitride such as silicon oxynitride.

After a first photoresist film (not shown) is coated on the first hard mask layer 65, a first photoresist film pattern 70 is formed on the first hard mask layer 65 by exposing and developing the first photoresist film.

Referring to FIG. 2B, the first hard mask layer 65 is etched using the first photoresist pattern 70 as an etching mask to thereby form a first hard mask 75 on the first conductive layer 60. The first hard mask 75 defines a trench 80 and a first conductive layer pattern 85.

After the first photoresist pattern 70 is removed by an ashing process and/or a stripping process, the first conductive layer 60 and the tunnel oxide layer 55 are etched using the first hard mask 75 as an etching mask. Thus, a first conductive layer pattern 85 and a tunnel oxide layer pattern 90 are formed on the semiconductor substrate 50.

An upper portion of the semiconductor substrate 50 exposed by the first conductive layer pattern 85 and the tunnel oxide layer pattern 90 is partially etched to form the trench 80 at the upper portion of the semiconductor substrate 50. Particularly, the semiconductor substrate 50 is loaded into a chamber in order to etch the first conductive layer 60, the tunnel oxide layer 55 and the upper portion of the semiconductor substrate 50. After an etching gas for etching the first conductive layer 60 and the tunnel oxide layer 55 is introduced into the chamber, the first conductive layer 60 and the tunnel oxide layer 55 are sequentially etched. Thus, the tunnel oxide layer pattern 90 and the first conductive layer pattern 85 are formed on the semiconductor substrate 50. Then, the trench 80 is formed at the upper portion of the semiconductor substrate 50 by partially etching the upper portion of the semiconductor substrate 50 in the chamber. The trench 80 may have a depth of about 1,200 Å to about 2,500 Å. For example, the trench 80 has a depth of about 1,700 Å.

According to some embodiments of the present invention, using the first hard mask 75 as an etching mask, the first conductive layer 60, the tunnel oxide layer 55 and the upper portion of the semiconductor substrate 50 may be sequentially etched so that the trench 80 may be formed at the upper portion of the semiconductor substrate 50, and the tunnel oxide layer pattern 90 and the first conductive layer pattern 85 may be simultaneously formed on the semiconductor substrate 50.

According to some embodiments of the present invention, the first photoresist pattern 70 may be completely consumed without performing any additional process while forming the first conductive layer pattern 85, the tunnel oxide layer pattern 90 and the trench 80.

Referring to FIG. 2C, after an insulation layer (not shown) is formed on the semiconductor substrate 50 to fill up the trench 80 by a CVD process, the insulation layer is partially removed by a chemical mechanical polishing (CMP) process, an etch-back process, or a combination process of CMP and etch-back. Thus, an isolation layer 95 filling up the trench 80 is formed at the upper portion of the semiconductor substrate 50. Particularly, the insulation layer is formed on the semiconductor substrate 50 and the first hard mask 75 using an oxide that has a good gap filling characteristic to sufficiently fill up the trench 80. For example, the insulation layer is formed using a high-density plasma-chemical vapor deposition (HDP-CVD) oxide. When the insulation layer is partially removed by the CMP process and/or the etch-back process until the first conductive layer pattern 85 is exposed, the isolation layer 95 filling up the trench 80 is formed.

The first hard mask 75 is removed by a dry etching process or a wet etching process. When first hard mask 75 is removed from the first conductive layer pattern 85, the isolation layer 95 filling the trench 80 may have a height substantially the same as that of the first conductive pattern 85.

Referring to FIG. 2D, a second conductive layer 100 and a second hard mask layer 105 are sequentially formed on the first conductive layer 85 and the isolation layer 95.

The second conductive layer 100 may have a thickness of about 1,000 Å to about 1,400 Å. For example, the second conductive layer 100 has a thickness of about 1,200 Å. After a polysilicon layer or an amorphous silicon layer is formed on the first conductive layer pattern 85 and the isolation layer 95 by a CVD process or a plasma-enhanced chemical vapor deposition (PECVD) process, the second conductive layer 100 is formed by doping impurities into the polysilicon layer or the amorphous silicon layer. The impurities may be doped into the polysilicon layer or the amorphous silicon layer by a $POCl_3$ diffusion process, an ion implantation process or an in-situ doping process.

The second hard mask layer 105 is formed using a material having an etching selectivity relative to the isolation layer 95 and the second conductive layer 100. The second hard mask layer 105 is formed using a nitride such as silicon nitride or an oxynitride such as silicon oxynitride. According to some embodiments of the present invention, the first and the second hard mask layers 65 and 105 may be formed using substantially similar materials. According to some embodiments of the present invention, the first hard mask layer 65 may be formed using a material different from that of the second hard mask layer 105.

After a second photoresist film (not shown) is formed on the second hard mask layer 105, a second photoresist pattern 110 is formed on the second hard mask layer 105 by exposing and developing the second photoresist film.

Referring to FIG. 2E, the second hard mask layer 105 is etched using the second photoresist pattern 110 as an etching mask, thereby forming a second hard mask 115 on the second conductive layer 100.

After the second photoresist pattern 110 is removed by an ashing process and/or a stripping process, the second conductive layer 100 is partially etched using the second hard mask 115 as an etching mask. Thus, a second conductive layer pattern 120 is formed on the first conductive layer pattern 85. In an example embodiment of the present invention, the second photoresist pattern 110 may be completely consumed without performing any additional process while forming the second conductive layer pattern 120. The second conductive layer pattern 120 may have a width slightly wider than that of the first conductive layer pattern 85 along the first direction.

When the second hard mask 115 is removed from the second conductive layer pattern 120, a floating gate 125 including the first and the second conductive layer patterns 85 and 120 is formed on the semiconductor substrate 50. The floating gate 125 further includes the tunnel oxide layer pattern 90 positioned beneath the first conductive layer pattern 85.

Referring to FIG. 2F, a first dielectric layer 130 and a second dielectric layer 135 are successively formed on the second conductive layer pattern 120 of the floating gate 125 and the isolation layer 95.

According to some embodiments of the present invention, the first dielectric layer 130 may be formed by depositing a metal silicon oxide ($M_xSi_yO_2$) on the isolation layer 95 to cover the second conductive layer pattern 120. Here, $0<x\leq1$, $0<y\leq1$ and x+y 1. For example, x is about 0.75 and y is about 0.25. The first dielectric layer 130 may be formed by a CVD process or a PVD process. For example, the first dielectric layer 130 is formed by a PECVD process, an ALD process, a sputtering process or a PLD process.

The first dielectric layer 130 may have a thickness of about 30 Å to 100 Å measured from an upper face of the second conductive layer pattern 120. The first dielectric layer 130 may include the metal silicon oxide such as a metal silicon oxide containing a transition metal in Group IV, a metal silicon oxide containing a transition metal in Group V or a metal silicon oxide containing a rare earth metal. The transition metal in Group IV may include titanium (Ti), zirconium (Zr) or hafnium (Hf). The transition metal in Group V may include vanadium (V), niobium (Nb) or tantalum (Ta). The rare earth metal may include scandium (Sc), yttrium (Y) or lanthanum (La). For example, the first dielectric layer 130 includes a hafnium silicon oxide ($Hf_xSi_yO_2$).

The second dielectric layer 135 may be formed on the first dielectric layer 130 by converting the metal silicon oxide in an upper portion of the first dielectric layer 130 into a metal silicon oxynitride ($M_xSi_yO_{2-z}N_z$). Here, $0<x\leq1$, $0<y\leq1$, x+y=1 and $0<z\leq1$. The second dielectric layer 135 may be formed by treating the upper portion of the first dielectric layer 130 using a plasma. The plasma may include ammonia ($NH_3$) plasma or nitrogen ($N_2$) plasma. Thus, the second dielectric layer 135 may include a metal silicon oxynitride generated from the metal silicon oxide in the first dielectric layer 130. In a formation of the second dielectric layer 135, the first dielectric layer 130 may be treated at a temperature of about 300° C. to about 900° C. for about 60 seconds to about 180 seconds by applying a power of about 250 W to about 800 W. Since the first dielectric layer 130 contains the metal silicon oxide including the transition metal or the rare earth metal, the second dielectric layer135 also contains the metal silicon oxynitride including a transition metal in Group IV, a transition metal in Group V or a rare earth metal. For example, the second dielectric layer 135 includes titanium silicon oxynitride, zirconium silicon oxynitride, hafnium silicon oxynitride, a vanadium silicon oxynitride, niobium silicon oxynitride, tantalum silicon oxynitride, scandium silicon oxynitride, yttrium silicon oxynitride, lanthanum oxynitride, etc.

When the second dielectric layer 135 is formed on the first dielectric layer 130, a preliminary dielectric structure 140 having the second dielectric layer 135 on the first dielectric layer 130 is formed on the floating gate 125. The preliminary structure 140 may have a composition represented by $[M_xSi_yO_2/M_xSi_yO_{2-z}N_z]$. That is, the preliminary dielectric structure 140 includes a metal a silicon oxide layer and a metal silicon oxynitride layer.

According to some embodiments of the present invention, when a plurality of the first dielectric layers 130 and a plurality of the second dielectric layers are repeatedly formed on the floating gate 125 and the isolation layer 95, the preliminary dielectric structure 140 including K (K is a positive integer) numbers of the first dielectric layers 130 and K numbers of the second dielectric layers 135 may be formed on the floating gate 125 and the isolation layer 95. Since each of the first and the second dielectric layers 130 and 135 has a composition of $M_xSi_yO_2$ and a composition of $M_xSi_yO_{2-z}N_z$, the preliminary dielectric structure 140 has an entire composition represented by $[M_xSi_yO_2/M_xSi_yO_{2-z}N_z]_4$.

According to some embodiments of the present invention, a wet etching process for removing a native oxide layer from on the semiconductor substrate 50 may be performed before the preliminary dielectric structure 140 is formed on the semiconductor 50 having the floating gate 125 and the isolation layer 95.

Figure 3:
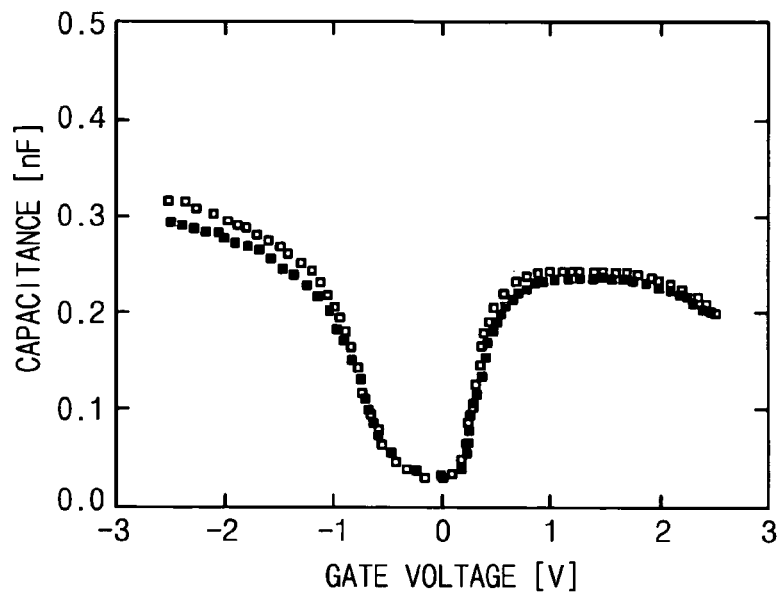
FIG. 3 is a graph illustrating capacitance variations of a single layer including hafnium silicon oxide and a double layer including hafnium silicon oxide/hafnium silicon oxynitride after thermal treatment processes.

FIG. 3 is a graph illustrating capacitance variations of a single layer including hafnium silicon oxide and a double layer including hafnium silicon oxide/hafnium silicon oxynitride after thermal treatment processes. In FIG. 3, the capacitance variation is measured relative to an applied gate voltage. In FIG. 3, "■" represents the capacitance variation of the single layer including hafnium silicon oxide, and "□" indicates the capacitance variation of the double layer including hafnium silicon oxide/hafnium silicon oxynitride.

Figure 4:
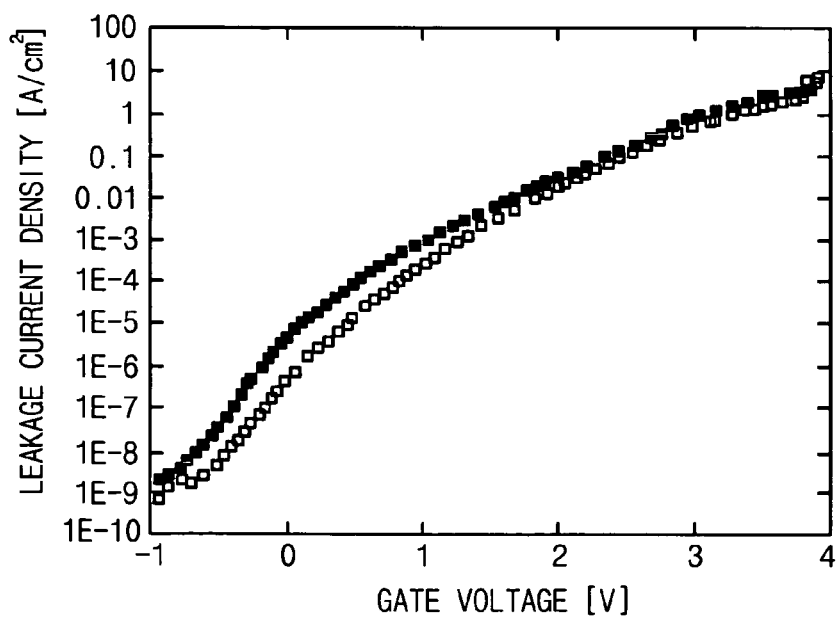
FIG. 4 is a graph illustrating leakage current densities of a single layer including hafnium silicon oxide and a double layer including hafnium silicon oxide/hafnium silicon oxynitride after thermal treatment processes.

FIG. 4 is a graph illustrating leakage current densities of a single layer including hafnium silicon oxide and a double layer including hafnium silicon oxide/hafnium silicon oxynitride after thermal treatment processes. In FIG. 4, the leakage current densities are measured relative to an applied gate voltage. In FIG. 4, "■" denotes the leakage current density of the single layer including hafnium silicon oxide, and "□" means the leakage current density of the double layer including hafnium silicon oxide/hafnium silicon oxynitride.

In FIGS. 3 and 4, the single layer and the double layer were formed by a first thermal treatment process at a temperature of about 750° C. and by a second thermal treatment process at a temperature of about 950° C. Since a typical dielectric layer of a non-volatile semiconductor memory device is thermally treated at a temperature of about 850° C. for about 20 minutes after the dielectric layer is formed on a typical floating gate, the capacitance variations and the leakage current densities of the single layer and the double layer were measured through the twice thermal treatment processes.

As illustrated in FIGS. 3 and 4, the double layer including hafnium silicon oxide/hafnium silicon oxynitride has a capacitance higher than that of the single layer including hafnium silicon oxide. Additionally, the double layer including hafnium silicon oxide/hafnium silicon oxynitride has a leakage current density lower than that of the single layer including hafnium silicon oxide. In particular, when the gate voltage (Vg) is about 1.5V and an applied current is about 1.7 A, a capacitance equivalent thickness (CET) of the double layer including hafnium silicon oxide/hafnium silicon oxynitride is about 24.1 Å, whereas a capacitance equivalent thickness (CET) of the single layer including hafnium silicon oxide is about 25.8 Å. Since the CET of the double layer including hafnium silicon oxide/hafnium silicon oxynitride is lower than that of the single layer including hafnium silicon oxide by about $0.848\times10^{-5}$, the double layer including hafnium silicon oxide/hafnium silicon oxynitride may have electrical characteristics considerably improved in comparison with those of the single layer including hafnium silicon oxide. Since hafnium silicon oxynitride has a thermal resistance superior to that of hafnium silicon oxide, the double layer including hafnium silicon oxide/hafnium silicon oxynitride may have a thermal resistance high than that of the single layer including hafnium silicon oxide.

Referring to FIG. 2G, a third conductive layer 145 is formed on the preliminary dielectric structure 140. The third conductive layer 145 may be formed using polysilicon doped in $N^+$ type impurities. Alternatively, the third conductive layer 145 may include polysilicon and a metal silicide. Here, the metal silicide may include tungsten silicide ($WSi_x$), titanium silicide ($TiSi_x$), cobalt silicide ($CoSi_x$) or tantalum silicide ($TaSi_x$).

Referring to FIG. 2H, after a third photoresist pattern (not shown) is formed on the third conductive layer 145, the third conductive layer 145 and a preliminary dielectric structure 140 are sequentially etched using the third photoresist pattern as an etching mask. Hence, a dielectric structure 165 and a control gate 150 are formed on the floating gate 125. In particular, the third conductive layer 145, the second dielectric layer 135 and the first dielectric layer 130 are sequentially etched to thereby form a first dielectric layer pattern 160, a second dielectric layer pattern 155 and a third conductive layer pattern 150 (i.e., the control gate 150) on the floating gate 125. The first and the second dielectric layers 130 and 135 and the third conductive layer 145 may be etched by a dry etching process.

According to some embodiments of the present invention, since a dielectric structure includes at least one metal silicon oxide layer and at least one metal silicon oxynitride layer, the dielectric structure may have a high dielectric constant and also have a good thermal resistance without thermal damage in a thermal treatment process. When a non-volatile semiconductor memory device includes the dielectric structure, the non-volatile semiconductor memory device may also have good electrical characteristics such as a high capacitance and a low leakage current.

The foregoing is illustrative of the present invention and is not to be construed as limiting thereof. Although a few example embodiments of this invention have been described, those skilled in the art will readily appreciate that many modifications are possible in the example embodiments without materially departing from the novel teachings and advantages of the present invention. Accordingly, all such modifications are intended to be included within the scope of the present invention as defined in the claims. Therefore, it is to be understood that the foregoing is illustrative of the present invention and is not to be construed as limited to the specific embodiments disclosed, and that modifications to the disclosed embodiments, as well as other embodiments, are intended to be included within the scope of the appended claims. The invention is defined by the following claims, with equivalents of the claims to be included therein.

What is claimed is:

1. A non-volatile semiconductor memory device comprising:
   a tunnel oxide layer pattern formed on a semiconductor substrate;
   a floating gate formed on the tunnel oxide layer pattern;
   a dielectric structure formed on the floating gate, the dielectric structure comprising at least one first dielectric layer pattern including a metal silicon oxide and at least one second dielectric layer pattern including a metal silicon oxynitride,
   wherein the at least one second dielectric layer pattern is formed on the at least one first dielectric layer pattern; and
   a control gate formed on the dielectric structure.

2. The non-volatile semiconductor memory device of claim 1, wherein the floating gate comprises a first conductive layer pattern formed on the tunnel oxide layer pattern and a second conductive layer pattern formed on the first conductive layer pattern.

3. The non-volatile semiconductor memory device of claim 2, wherein the first conductive layer pattern and the second conductive layer pattern independently comprise polysilicon doped with impurities or amorphous silicon.

4. The non-volatile semiconductor memory device of claim 1, wherein the first dielectric layer pattern comprises material selected from the group consisting of a metal silicon oxide including a transition metal in Group IV, a metal silicon oxide including a transition metal in Group V and a metal silicon oxide including a rare earth metal.

5. The non-volatile semiconductor memory device of claim 4, wherein the second dielectric layer pattern comprises material selected from the group consisting of a metal silicon oxynitride including a transition metal in Group IV, a metal silicon oxynitride including a transition metal in Group V, and a metal silicon oxynitride including a rare earth metal.

6. The non-volatile semiconductor memory device of claim 1, wherein the dielectric structure comprises a plurality of first dielectric layer patterns and a plurality of second dielectric layer patterns.

7. The non-volatile semiconductor memory device of claim 1, wherein the control gate comprises doped polysilicon or polysilicon and a metal silicide.

* * * * *